United States Patent [19]
Katakabe et al.

[11] Patent Number: 5,943,578
[45] Date of Patent: Aug. 24, 1999

[54] METHOD OF MANUFACTURING A SEMICONDUCTOR DEVICE HAVING AN ELEMENT ISOLATING REGION

[75] Inventors: Ichiro Katakabe; Naoto Miyashita; Hiroshi Kawamoto, all of Yokohama, Japan

[73] Assignee: Kabushiki Kaisha Toshiba, Kawasaki, Japan

[21] Appl. No.: 08/840,697

[22] Filed: Apr. 25, 1997

Related U.S. Application Data

[62] Division of application No. 08/662,468, Jun. 13, 1996, abandoned, which is a continuation of application No. 08/186,937, Feb. 2, 1994, abandoned, which is a continuation-in-part of application No. 08/013,785, Feb. 5, 1993, abandoned.

[30] Foreign Application Priority Data

Jun. 14, 1995 [JP] Japan ................................. 7-147372

[51] Int. Cl.$^6$ ................................................. H01L 21/331
[52] U.S. Cl. ............................ 438/359; 438/380; 438/361; 438/425; 438/426; 438/427; 438/428; 438/429; 438/430; 438/436; 438/437
[58] Field of Search .................................. 438/309, 318, 438/359, 360, 361, 337, 424, 425, 426, 427, 428, 429, 430, 435, 436, 437, FOR 165, FOR 223, FOR 224, FOR 225, FOR 226, FOR 227

[56] References Cited

U.S. PATENT DOCUMENTS

| | | | |
|---|---|---|---|
| 4,829,015 | 5/1989 | Schaber et al. | 437/31 |
| 4,965,217 | 10/1990 | Desilets et al. | 437/32 |
| 5,141,888 | 8/1992 | Kawaji et al. | 437/33 |
| 5,385,861 | 1/1995 | Bashir et al. | 437/67 |
| 5,411,913 | 5/1995 | Bashir et al. | 437/67 |
| 5,536,675 | 7/1996 | Bohr | 437/67 |
| 5,646,063 | 7/1997 | Mehta et al. | 437/67 |
| 5,683,932 | 11/1997 | Bashir et al. | 437/67 |
| 5,691,232 | 11/1997 | Bashir et al. | 437/67 |

*Primary Examiner*—Peter Toby Brown
*Assistant Examiner*—Long Pham
*Attorney, Agent, or Firm*—Finnegan, Henderson, Farabow, Garrett & Dunner, L.L.P.

[57] ABSTRACT

The first trench is formed in the region of the semiconductor substrate, in which an element isolation region is to be formed, and the first buried member, which is insulative, is buried in the first trench. Then, the second trench, having a width smaller than that of the first trench, is made in the first buried member, and the portion of the semiconductor substrate which is located at the bottom portion of the first trench, and the insulating second buried member is buried in the second trench, thereby forming the element isolation region.

15 Claims, 9 Drawing Sheets

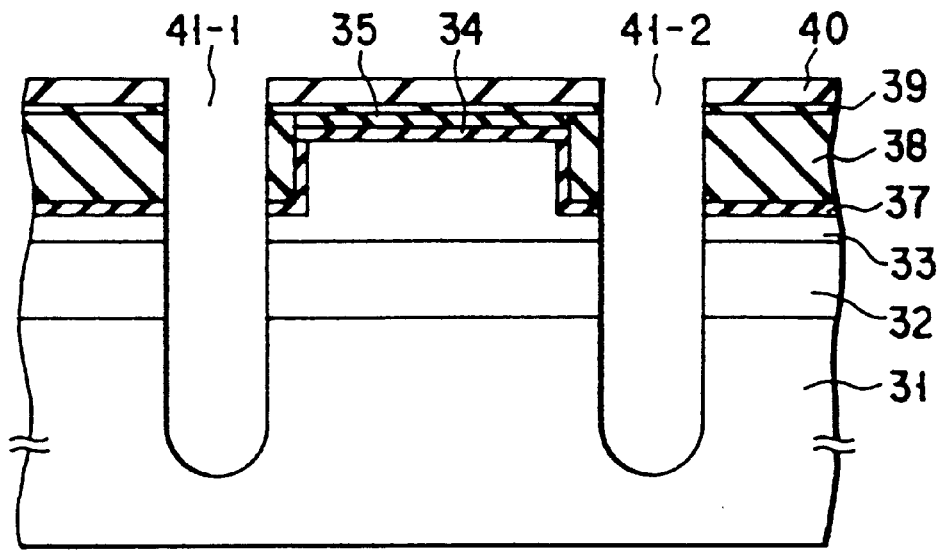
F I G. 4F
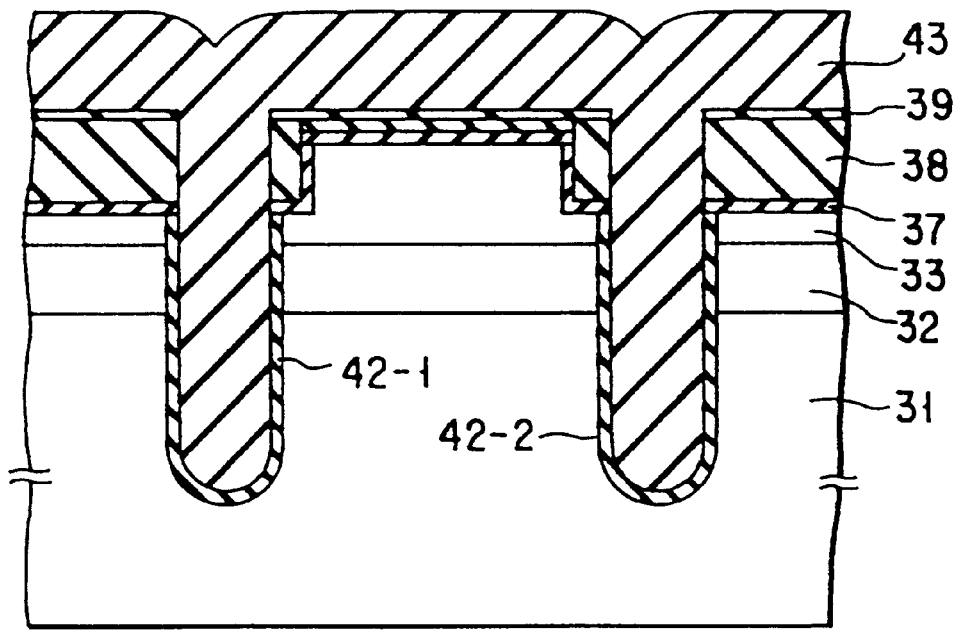
F I G. 4G

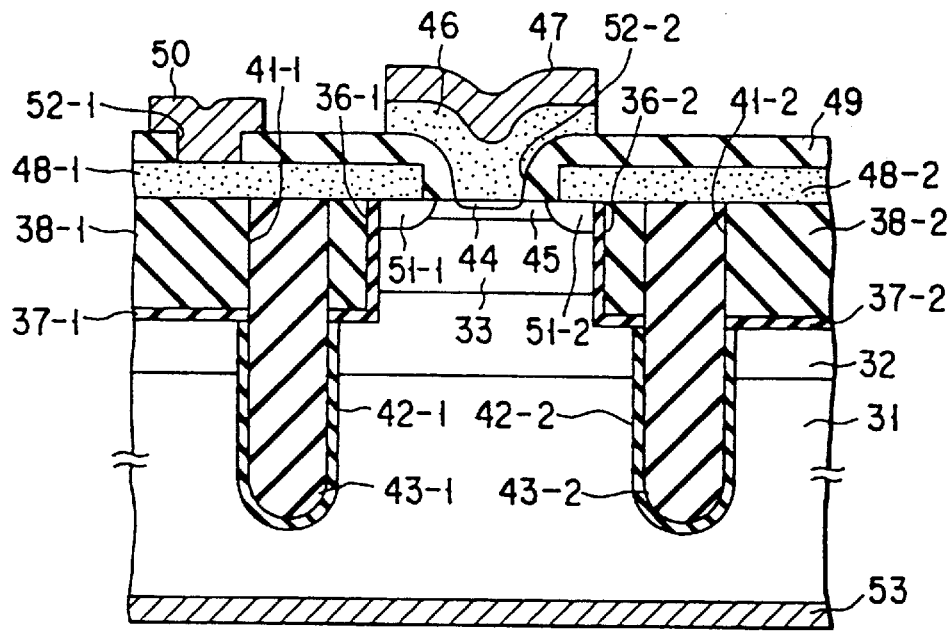
F I G. 5
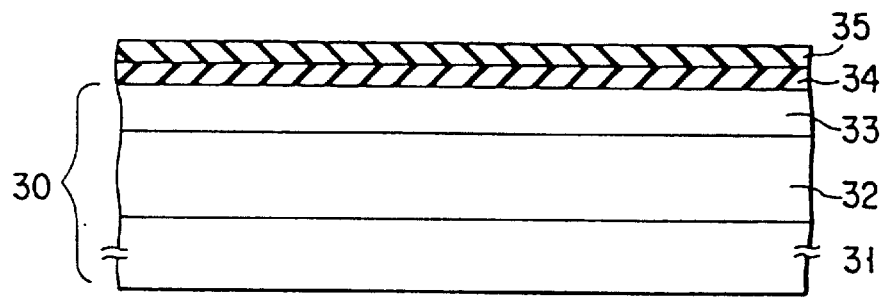
F I G. 6 A
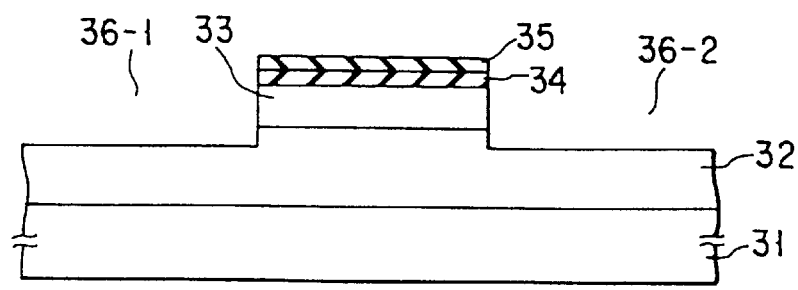
F I G. 6 B

METHOD OF MANUFACTURING A SEMICONDUCTOR DEVICE HAVING AN ELEMENT ISOLATING REGION

This is a division of application Ser. No. 08/662,468 filed Jun. 13, 1996, now abandoned, which is a continuation of application Ser. No. 08/186,937 filed Feb. 02, 1994, now abandoned, which is a continuation in part of application Ser. No. 08/013,785 filed Feb. 05, 1993, now abandoned.

BACKGROUND OF THE INVENTION

1. Field of the Invention

The present invention relates to a semiconductor device such as a bipolar transistor, or a semiconductor device of a BiCMOS type or the like, including a bipolar transistor and a MOS transistor, and a method of manufacturing such a device, particularly, an element isolation technique.

2. Description of the Related Art

According to a conventional element isolation technique used for a semiconductor device, after forming a field oxide film by a LOCOS method, a deep trench is formed in a silicon substrate, and the surface of the silicon substrate is subjected to a thermal oxidation, in order to fill the inside of the trench will polysilicon, as can be seen in FIGS. 1A to 1E. Such an element isolation structure is disclosed in, for example, Hiroshi Goto et al. "A New Isolation Technology For Bipolar VLSI LOGIC (IOP-L)", Symposium on VLSI Technology, 1985. According to a conventional element isolation technique used for a semiconductor device, after forming a deep trench is formed, the inside of the trench and the surface of the substrate are oxidized at the same time by a LOCOS method, and the inside of the trench is filled with polysilicon, as can be seen in FIGS. 2A to 2D. Such an element isolation structure is disclosed in, for example, U.S. Pat. No. 5,332,683.

More specifically, according to the former technique, first, as shown in FIG. 1A, the main surface of a silicon substrate 11 is subjected to a thermal oxidation, so as to form an $SiO_2$ film 12, and then a $Si_3N_4$ film 13 serving as an anti-oxidization film is formed on the $SiO_2$ film 12. Then, the $Si_3N_4$ film 13 is etched so that the patterned film remains on the element region. Next, as shown in FIG. 1B, the main surface of the substrate 11 is subjected to a thermal oxidation using the $Si_3N_4$ film 13, and thus a field oxide film 14 is formed. After that, the $Si_3N_4$ film 13 is removed, and a $Si_3N_4$ film 15 is formed on the $SiO_2$ film 12 and the field oxide film 14. Then, a CVD-$SiO_2$ film 16 is formed on the $Si_3N_4$ film 15 to prepare what is shown in FIG. 1C.

Subsequently, trenches 17-1 and 17-2 both having a sufficient depth are formed in the substrate 11 by anisotropic etching such as of an RIE method (see FIG. 1D). The surface portion of the substrate 11, which is exposed inside the trenches 17-1 and 17-2 is subjected to thermal oxidation, so as to form oxide films 18-1 and 18-2. Then, the trenches 17-1 and 17-2 are filled with polysilicon layers 19-1 and 19-2, and the surface portions of the polysilicon layers 19-1 and 19-2 in the trenches 17-1 and 17-2 are thermal-oxidized, thus forming $SiO_2$ films 20-1 and 20-2. After that, the CVD-$SiO_2$ film 16 and the $Si_3N_4$ film 15 are removed to obtained an element isolation structure as shown in FIG. 1E.

Subsequently, though not shown in the figures, a semiconductor element such as a bipolar transistor or the like, is formed by a conventional manufacturing method, within an element region which is isolated by the field oxide film 14 and the trenches 17-1 and 17-2.

In the meantime, according to the latter method, as can be seen in FIG. 2A, the main surface of the silicon substrate 21 is thermal-oxidized to form an $SiO_2$ film 22, and a $Si_3N_4$ film which serves as an oxidation-resisting film, is formed on the $SiO_2$ film 22. After that, the $Si_3N_4$ film 23 is etched so that the patterned film remains on the element region. Then, a CVD-$SiO_2$ film 24 is formed on the entire surface of each of the $SiO_2$ and the $Si_3N_4$ film. Next, the CVD-$SiO_2$ film 24, the $SiO_2$ film 22 and the substrate 21 in the region in which a field oxide film is to be formed, is selectively etched by anisotropic etching such as an RIE method, so as to prepare trenches 25-1 and 25-2 each having a sufficient depth. Subsequently, the portions of the $SiO_2$, which are not masked by the CVD-$SiO_2$ and the $Si_3N_4$ film 23, are removed, and the surface of the substrate 21 is exposed as can be seen in FIG. 2C. Subsequently, with use of the $Si_3N_4$ film 23 as a mask, the surface of the substrate 21 and the surface of the portion of the substrate 21 which are exposed within the trenches 25-1 and 25-2 are selectively oxidized, and thus a $SiO_2$ film 26 serving as a field oxide film is formed as shown in FIG. 2D. After that, the trenches 25-1 and 25-2 are filled with the polysilicon layers 27-1 and 27-2, and the exposed surfaces of the polysilicon layers 27-1 and 27-2 are thermal-oxidized so as to form the $SiO_2$ films 28-1 and 28-2. Then, after removing the portion of the $Si_3N_4$ film 23, which remains on the element region, a semiconductor element such as a bipolar transistor, is formed within the element region by a conventional manufacturing method.

However, with the conventional method of forming an element isolation region, in which a field oxide film is formed by the LOCOS method as described above, a bird's beak having a width equivalent to the thickness of the field oxide film is inevitably formed. Therefore, the element region must be enlarged by an area corresponding to the bird's beak, making it difficult to increase the degree of integration. Further, when the bird's beak is large, the parasitic capacitance in that area becomes large, making it difficult to increase the speed of processing in the device.

Moreover, with the method of filling the inside of a trench for isolating an element with a polysilicon layer, it is necessary to form an insulation film such as a thermal oxidation film, on the side wall of the trench for isolation of the element. As a result, a parasitic capacitance is formed between the polysilicon layer buried in a trench, and a silicon substrate, making it difficult to increase the processing speed of the element.

As described above, with the conventional semiconductor device and the method of manufacturing such a device, the element isolation region serves to make it difficult to increase the degree of integration, and a parasitic capacitance is formed in the element isolation region, making it difficult to increase the switching speed of the device.

SUMMARY OF THE INVENTION

The first object of the present invention is to provide a semiconductor device having a high degree of integration and a high-speed operation.

The second object of the present invention is to provide a method of manufacturing such a semiconductor device having a high degree of integration and a high-speed operation.

The first object can be achieved by a semiconductor device comprising: a first trench made in an element isolation region in a semiconductor substrate; a first buried member buried in the first trench; a second trench made in the first buried member in the first trench and in the semiconductor substrate at a bottom portion of the first trench, to have a width narrower and a depth deeper than those of the first trench; a second buried member buried in the second trench; and a semiconductor element formed in an element region of the semiconductor substrate, which is isolated by the first trench and the second trench.

According to the above-described structure, the element isolation region is provided with the shallow first trench, and the first buried member formed in the first trench, and the deep second trench made in the first buried member and the semiconductor substrate, and the second buried member formed in the second trench. Therefore, a bird's beak, which is created in the case where a field oxide film is formed by the LOCOS method, is never formed. Consequently, it is not necessary to increase the element region, and thus the degree of integration can be increased. Further, the parasitic capacitance of the element isolation region is small, the operational speed of the device can be increased.

The second object of the present invention can be achieved by a method of manufacturing a semiconductor device, comprising the steps of: making a first trench in a surface region of a semiconductor substrate; burying a first buried member in the first trench; making a second trench having a width narrower and a depth deeper than those of the first trench, in the first buried member and in the semiconductor substrate underneath the buried member; and burying a second buried member into the second trench.

According to the manufacturing method described above, the LOCOS method is not used for the formation of the element isolation region. Therefore, the problem of the bird's beak, which rises when the LOCOS method is used, does not occur. Consequently, a decrease in the degree of integration, or a reduction in the operational speed due to the parasitic capacitance does not happen. Rather, the degree of integration and the operational speed of the device can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 4A to 4I are cross sectional views illustrating steps of manufacturing the bipolar transistor shown in FIG. 3, designed to explain a method of manufacturing a semiconductor device according to the first embodiment of the present invention;

FIG. 5 is a cross sectional view of a bipolar transistor, designed to explain a semiconductor device according to the second embodiment of the present invention;

FIGS. 6A and 6B are cross sectional views illustrating part of steps of manufacturing the bipolar transistor shown in FIG. 5, designed to explain a method of manufacturing a semiconductor device according to the second embodiment of the present invention;

DETAILED DESCRIPTION OF THE PREFERRED EMBODIMENTS

Figure 1A:
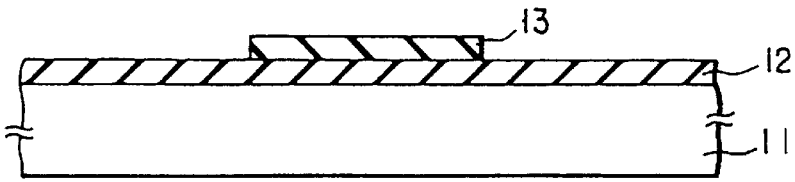
FIGS. 1A to 1E are cross sectional views illustrating sequential steps of a process of manufacturing an element isolation region, designed to explain a conventional semiconductor device and a method of manufacturing such a device.
Figure 1B:
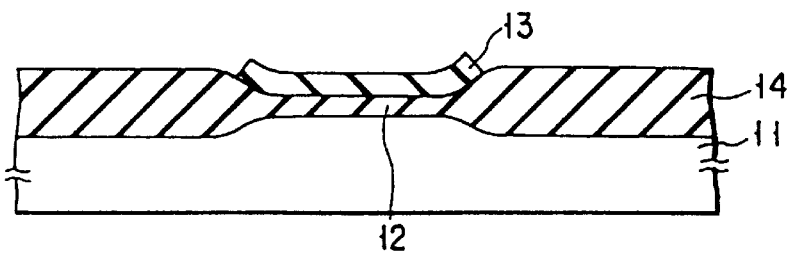
Figure 1C:
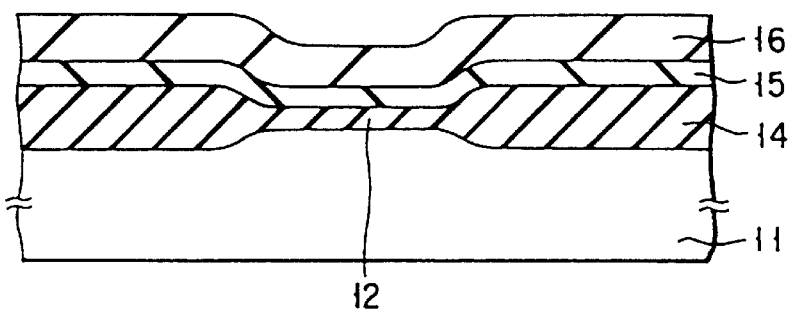
Figure 1D:
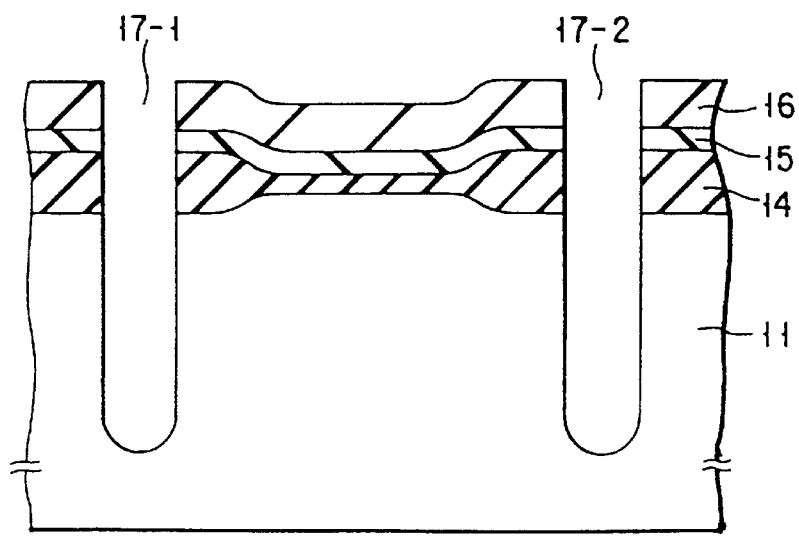
Figure 1E:
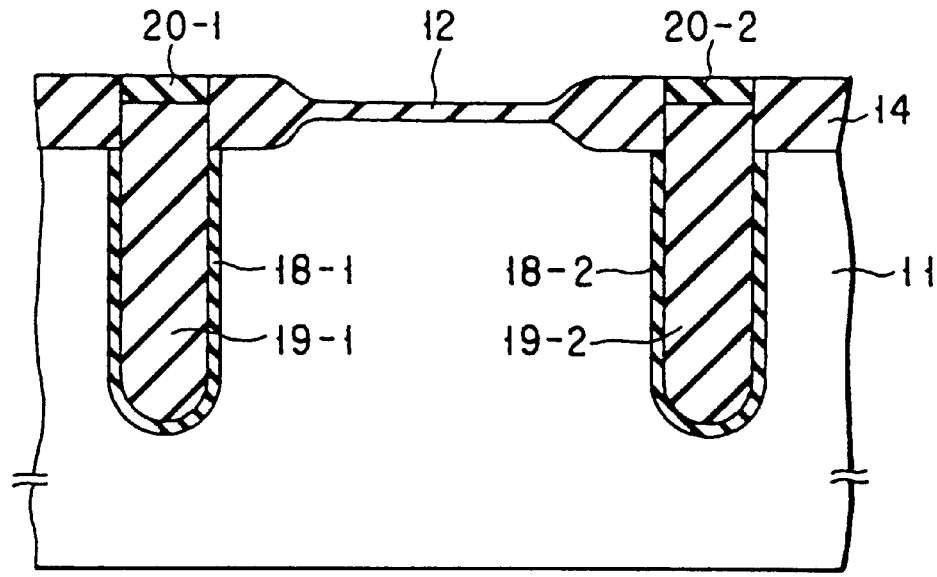
Figure 3:
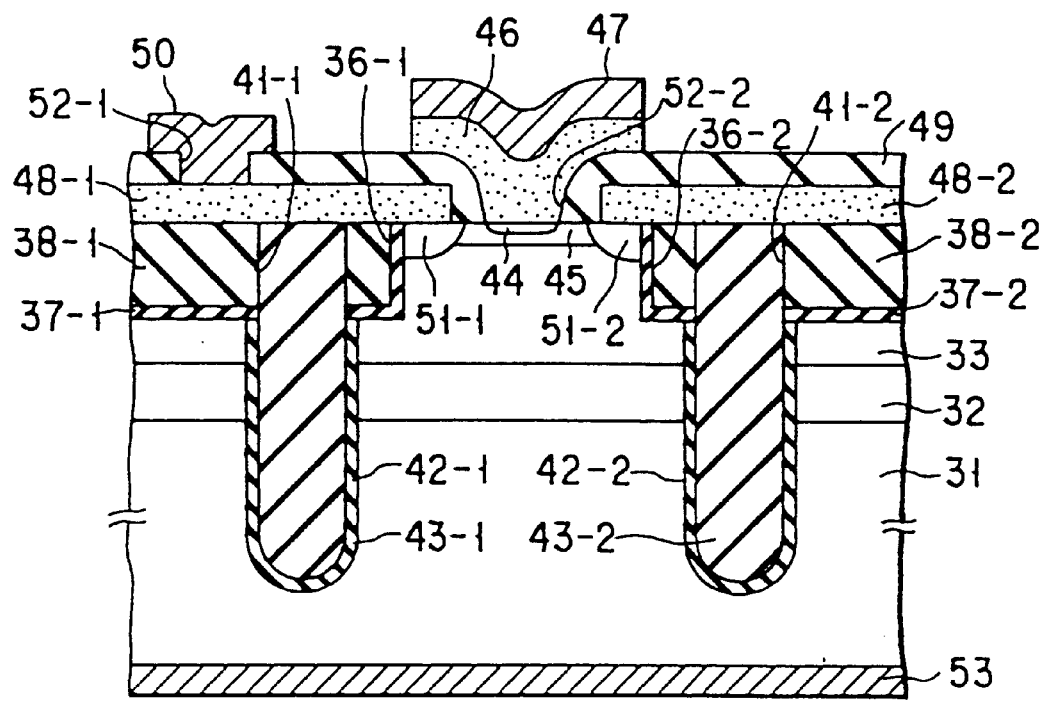
FIG. 3 is a cross sectional view of a bipolar transistor, designed to explain a semiconductor device according to the first embodiment of the present invention.
Figure 2A:
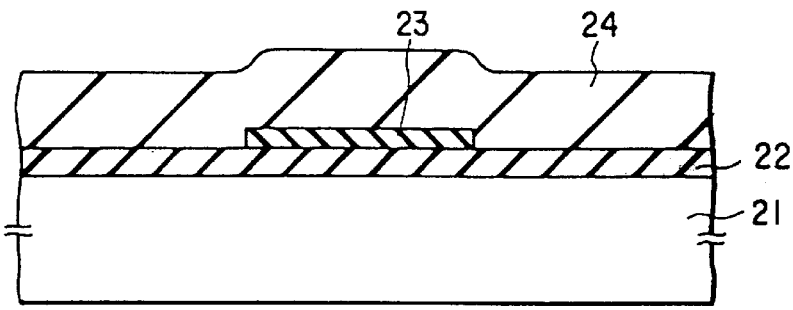
FIGS. 2A to 2D are cross sectional views illustrating sequential steps of a process of manufacturing an element isolation region, designed to explain another conventional semiconductor device and a method of manufacturing such a device.
Figure 2B:
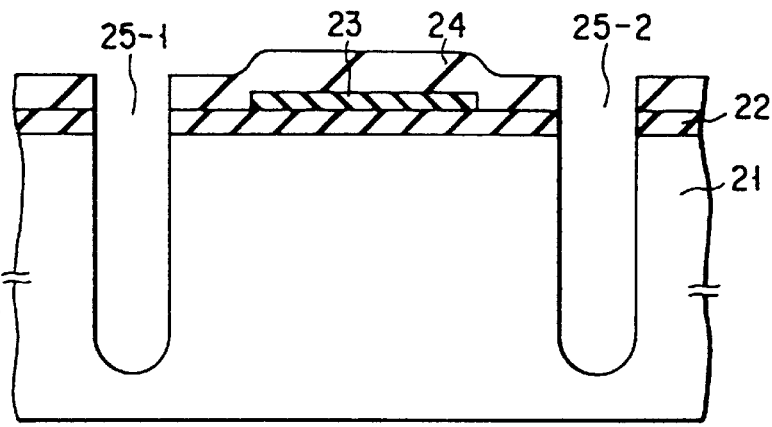
Figure 2C:
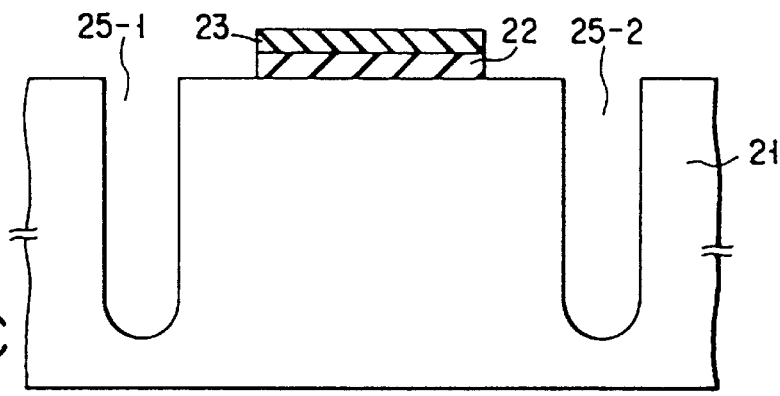
Figure 2D:
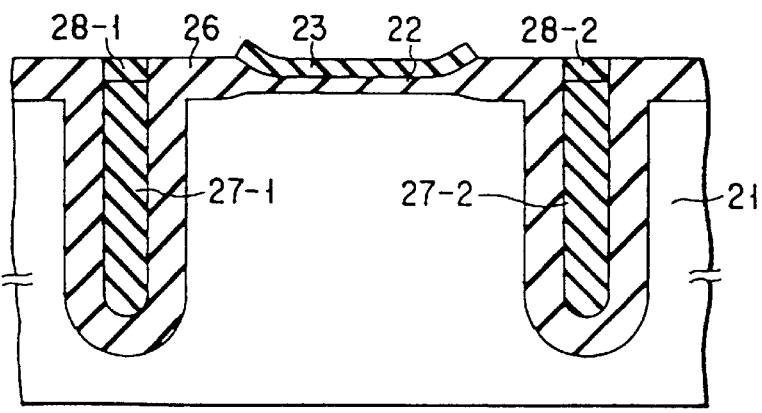

FIG. 3 is a cross sectional view showing the structure of a semiconductor device according to the first embodiment of the present invention. FIG. 3 shows a bipolar transistor as an example of the semiconductor device. In a P-type silicon substrate 31, an $N^+$-type buried layer 32 is formed, and an N-type epitaxial layer 33 is formed on the layer 32. First trenches 36-1 and 36-2 are made in the epitaxial layer 33, so as to have a depth shallower than the thickness of the layer 33. $SiO_2$ films 37-1 and 37-2 are formed on the surfaces of the first trenches 36-1 and 36-2, respectively. CVD-$SiO_2$ films 38-1 and 38-2 (the first buried members) are buried in the first trenches 36-1 and 36-2, respectively. The second trenches 41-1 and 41-2 are made within the first trenches 36-1 and 36-2, respectively, so as to be deeper than these trenches. The second trenches 41-1 and 41-2 are made through the CVD-$SiO_2$ films 38-1 and 38-2 formed in the first trenches 36-1 and 36-2, respectively, the $SiO_2$ films 37-1 and 37-2, the epitaxial layer 33 and the buried layer 32, so as to reach into the substrate 31. Thermal $SiO_2$ films 42-1 and 42-2 are formed on the surfaces of the second trenches 41-1 and 41-2. CVD-$SiO_2$ films 43-1 and 43-2 (the second buried members) are buried in the second trenches 41-1 and 41-2. A base region 45 is formed in a section of an epitaxial layer 33 (collector region), which is defined by the trenches 36-1, 41-1, 36-2 and 41-2. On both sides of the base region 45, diffusion layers 51-1 and 51-2 having the same conductivity type as that of the base region, and a high impurity concentration, are formed. An emitter region 44 is formed in the surface region of the base region 45. Polysilicon layers 48-1 and 48-2 are respectively formed on the CVD-$SiO_2$ films 38-1 and 38-2 in the trenches 36-1 and 36-2, and the end portions of the polysilicon layers 48-1 and 48-2 are electrically connected to the impurity diffusion layers 51-1 and 51-2. A CVD-$SiO_2$ film 49 is formed on the resultant structure. Contact holes 52-1 and 52-2 are made in the polysilicon layer 48-1 of the $SiO_2$ layer 49 and the emitter region 44. A polysilicon layer 46 is formed on the $SiO_2$ film 49 and in the contact hole 52-2. An emitter electrode 47 is formed on the polysilicon layer 46. A base electrode 50 is formed on the $SiO_2$ film 49 and the contact hole 52-1. A collector electrode 53 is formed on the rear surface side of the silicon substrate 31.

In the bipolar transistor shown in FIG. 3, the first trenches 36-1 and 36-2, the CVD-SiO$_2$ films 38-1 and 38-2 formed in the trenches 36-1 and 36-2, the second trenches 41-1 and 41-2, and the CVD-SiO$_2$ films 43-1 and 43-2 formed in the trenches 41-1 and 42-2, function as an element isolation region. With this element isolation region, the bipolar transistor can be isolated from other elements. Consequently, a bird's beak, which causes a problem when a field oxide film is formed by the LOCOS method, is not formed, and therefore it is not necessary to enlarge the element region, making it possible to increase the degree of integration. Further, in such a bipolar transistor, the capacitance which parasitizes the element isolation region is very small, and therefore the operation speed of the product device can be increased.

FIGS. 4A to 4I illustrate serial steps of the method of manufacturing the bipolar transistor shown in FIG. 3, and the method will now be described while following the segments (1) to (10) provided below.

(1) First, an N$^+$-type buried layer 32 is formed in the main surface region of a P-type silicon substrate 31, and an N-type epitaxial layer 33 is deposited on the above structure, thus preparing a semiconductor wafer (semiconductor substrate) 30. A first thermal SiO$_2$ film 34 and a first Si$_3$N$_4$ film 35 which serves as a stopper for CMP (chemical mechanical polishing) in a later step, are laminated on the semiconductor wafer 30 (see FIG. 4A).

(2) A mask is formed by a photolithography, and other portions of the first Si$_3$N$_4$ film 35 and the first thermal SiO$_2$ film 34, than the regions in which elements are to be formed, are removed selectively by an RIE method. Subsequently, with use of this mask, the epitaxial layer 33 is etched about 0.7 μm by the RIE method, thus forming shallow trenches 36-1 and 36-2. The depth of each of the trenches 36-1 and 36-2 is less than the thickness of the epitaxial layer 33 (see FIG. 4B). The depth of each of the trenches 36-1 and 36-2, though it must be set in accordance with an element to be formed and the necessary characteristics, should preferably be in a range of 0.25 μm to 1.5 μm.

(3) After that, in order to recover the damage caused by the RIE, the surfaces of the shallow trenches 36-1 and 36-2 are etched with use of a solvent or through CDE, thus the surface of the epitaxial layer 33 is removed about 10 nm. Subsequently, the surface region of the epitaxial layer 33 is thermal-oxidized for about 10 nm, thus forming a second SiO$_2$ film 37. Then, a first CVD-SiO$_2$ film 37 is formed on the resultant structure, and the layer is planerized by CMP. The first Si$_3$N$_4$ film 35 serves as a stopper in the CMP, and the completion of the polishing can be determined. Thus, the shallow trenches 36-1 and 36-2 can be completely filled with the CVD-SiO$_2$ film 38 (see FIG. 4C).

Figure 4A:
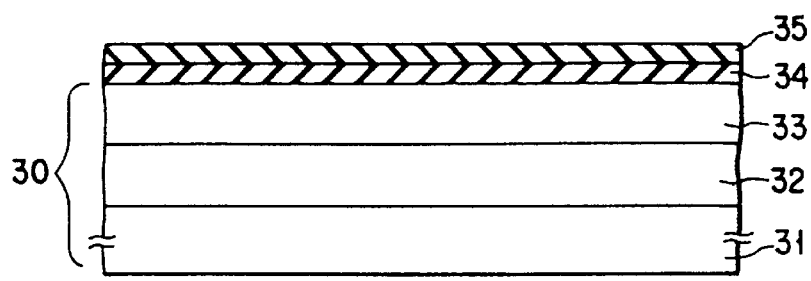
Figure 4B:
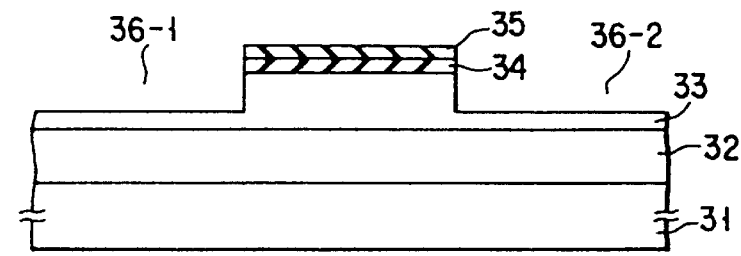
Figure 4C:
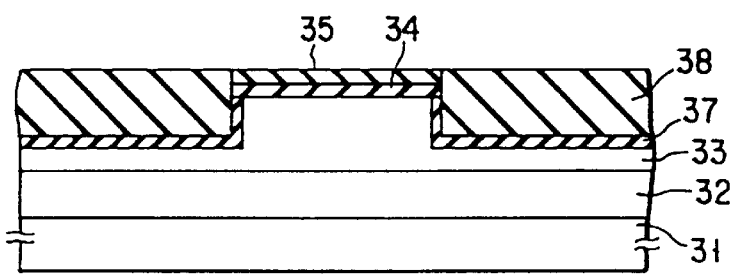
Figure 4D:
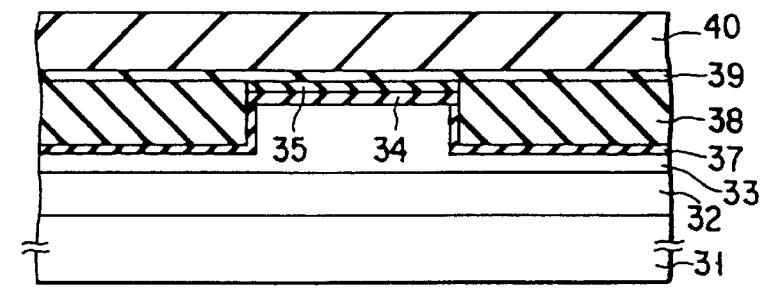

(4) Next, a second Si$_3$N$_4$ film 39 which serves as a stopper film for CMP, is formed on the first CVD-SiO$_2$ film 38 and the first Si$_3$N$_4$ film 35, and a second CVD-SiO$_2$ film 40 which serves as a mask member in the Si-RIE carried out to make a deep trench, is formed on the Si$_3$N$_4$ film 39 (see FIG. 4D).

Figure 4E:
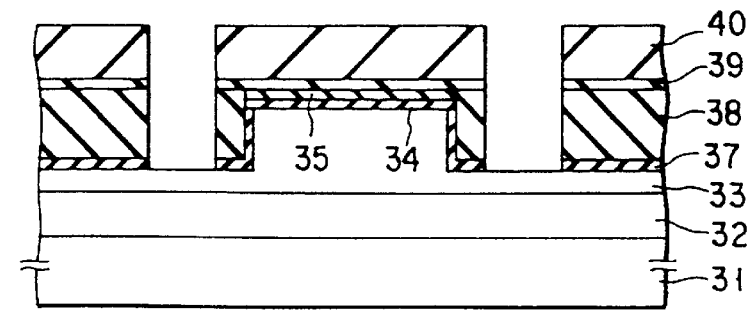
Figure 4H:
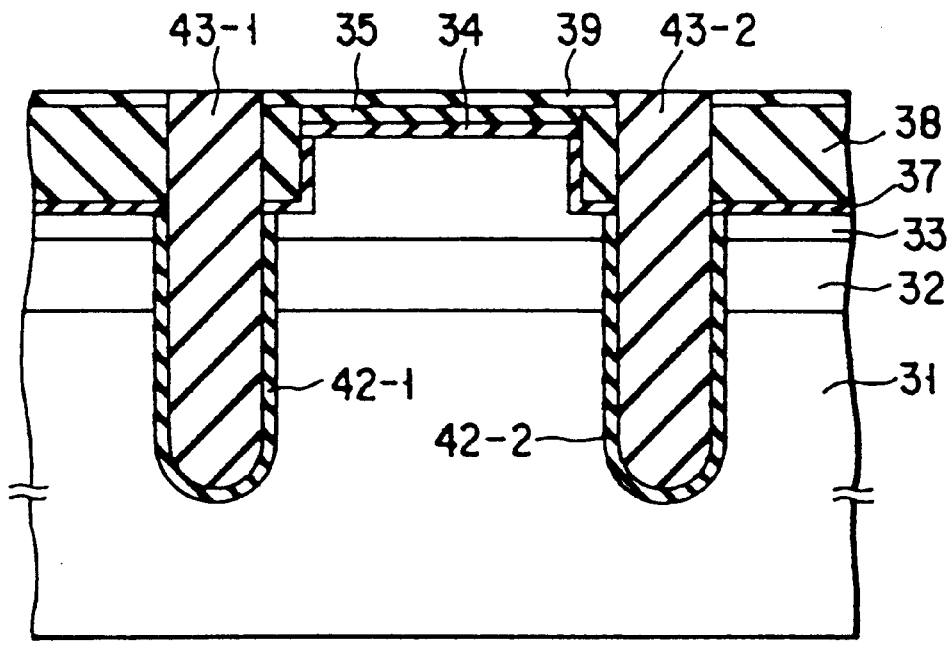
Figure 4I:
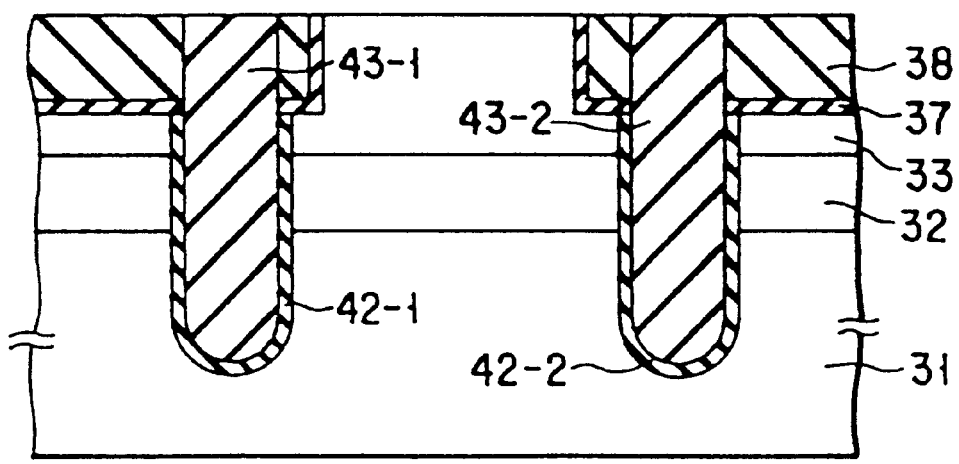

(5) A mask is formed by a photolithography, and the portions of the second CVD-SiO$_2$ film 40, the second Si$_3$N$_4$ film 39, the first CVD-SiO$_2$ film 38 and the second thermal SiO$_2$ film 37, in which a deep trench is formed, are etched by the RIE method (see FIG. 4E).

(6) Next, with use of the second CVD-SiO$_2$ film 40 as a mask, the epitaxial layer 33, the buried layer 32 and the silicon substrate 31 are etched by the RIE method, thus forming second trenches 41-1 and 41-2. Each of the second trenches 41-1 and 41-2 has a depth which reaches into the silicon substrate 31, and the depth should preferably be in a range of 3.0 to 10.0 μm. After that, the second CVD-SiO$_2$ 40 film is formed. Then, in order to recover the damaged portion caused by the RIE, the silicon layers in the second trenches 41-1 and 41-2 are etched by about 10 nm with use of a solvent or through the process of CDE (see FIG. 4F).

As described above, after the shallow trenches 36-1 and 36-2 are made and then planerized, the deep trenches 41-1 and 41-2 are made, thus forming an element isolation region. With this process, the width in which deep trenches 41-1 and 41-2 can be made from the boundary between the shallow trenches 36-1 and 36-2 and the element region, can be reduced very close to the limit which can achieve the highest alignment accuracy of the photolithography. In the case of a large width, the area of the element becomes large in consequence, and therefore the degree of integration cannot be increased. According to the method of the present invention for manufacturing a semiconductor device, the width can be reduced very close to the limit which can achieve the highest accuracy of the photolithography, and therefore the size of the element can be reduced, and the degree of integration can be increased accordingly.

(7) After that, third thermal SiO$_2$ films 42-1 and 42-2 are formed in the second trenches 41-1 and 41-2, and a third CVD-SiO$_2$ film 43 is formed on the resultant structure. Thus, the second trenches 41-1 and 41-2 are filled with the SiO$_2$ film 43 (see FIG. 4G).

(8) The portion of the third CVD-SiO$_2$ film 43 which is on the surface of the wafer is removed by the CMP, so as to leave CVD-SiO$_2$ films 43-1 and 43-2 only in the second trenches 41-1 and 41-2. It should be noted that the second Si$_3$N$_4$ film 39 serves as a stopper for the CMP (see FIG. 4H).

(9) Next, the second and first Si$_3$N$_4$ films 39 and 35 are removed by etching, and further the portion of the thermal SiO$_2$ film 34, which corresponds to the element formation region, is removed. Through the above-described steps, an N-type epitaxial layer 33 can be exposed only in the region where the element is to be formed, and the region other than that can be completely isolated by an insulating film (see FIG. 4I).

(10) After that, the resultant structure is subjected to the formation process for a conventional bipolar transistor, thus obtaining a bipolar transistor as shown in FIG. 3. In the structure shown in FIG. 3, an emitter region 44 is formed utilizing a polysilicon layer 46 as a diffusion source, and an emitter electrode 47 made of aluminum or the like, is formed on the polysilicon layer 46. Impurity diffusion regions 51-1 and 51-2 are formed utilizing polysilicon layers 48-1 and 48-2 as diffusion sources. The polysilicon layer 48-1 is used for guiding out the base region 45, and is connected to the base electrode 50 made of aluminum and the like, via a contact hole 52-1 made in an SiO$_2$ film 49 on the polysilicon layer 48-1. A collector electrode 53 is formed on the rear surface side of the silicon substrate 31.

According to the above-described manufacturing method, a thick thermal SiO$_2$ film, such as a field oxide film made by the LOCOS method, is not formed, and therefore a large bird's beak is not generated in the element region. Therefore, the element region can be reduced to the minimum area which the product device requires, thus the degree of integration of the device can be increased. Further, in accordance with the reduction in the element region, the parasitic capacitance can be lessened, and therefore the operational speed of the device can be increased.

Moreover, the CVD-SiO$_2$ films 43-1 and 43-2 are buried in the deep trenches 41-1 and 41-2, and therefore the width of each of the trenches 41-1 and 41-2 can be decreased as compared to the conventional manufacturing method in which polysilicon layers are buried in trenches, and the parasitic capacitance of each of the trenches 41-1 and 41-2 themselves, can be decreased. In this respect, the degree of integration and the operation speed can be further increased.

FIG. 5 is a cross sectional view of a bipolar transistor, which is designed to illustrate a semiconductor device according to the second embodiment of the present invention. The bipolar transistor has substantially the same structure as that shown in FIG. 3 except that the N-type epitaxial layer 33 is formed thin (0.7 to 1.0 $\mu$m) and the first trenches 36-1 and 36-2 reach into the N$^+$-type buried layer 32. The other structures are the same as those shown in FIG. 3.

Even in the above-described structure, if the first trenches 36-1 and 36-2 are made to have a depth which does not reach the silicon substrate 31, that is, the depth of each of the first trenches 36-1 and 36-2 is set less than the total of the thickness of the epitaxial layer 33 and that of the buried layer 32, substantially the same operational effect as that of the first embodiment can be obtained. Such a structure is suitable particularly for decreasing the collector resistance of the bipolar transistor, and increasing the switching speed.

FIGS. 6A and 6B are designed to explain the steps of manufacturing the bipolar transistor shown in FIG. 5, and illustrates initial stages of the manufacturing process. First, as shown in FIG. 6A, an N$^+$-type buried layer 32 is formed in the main surface region of the P-type silicon substrate 31, and an N-type epitaxial layer 33 having a thickness of about 0.7 to 1.0 $\mu$m is formed by deposition, thereby preparing a semiconductor wafer (semiconductor substrate) 30. On this semiconductor wafer 30, a first thermal SiO$_2$ film 34 and a first Si$_3$N$_4$ film 35 serving as a stopper for CMP in a later step are laminated.

Next, as shown in FIG. 6B, a mask is formed by a photolithography, and the portions of the first Si$_3$N$_4$ film 35 and the first thermal SiO$_2$ film 34, which are not in the region where the element is to be formed, are removed by the RIE technique. Further, using this mask, the epitaxial layer 33 and the buried layer 32 are etched continuously by about 0.7 to 1.5 $\mu$m through the process of RIE, thereby making shallow trenches 36-1 and 36-2. The depth of each of the trenches 36-1 and 36-2, though it must be set in accordance with an element to be formed and the necessary characteristics, should be a level which does not reach the silicon substrate 31.

The resultant structure is subjected to the steps described in the before-mentioned items (3) to (10), and thus a bipolar transistor as shown in FIG. 5 is manufactured.

Figure 7A:
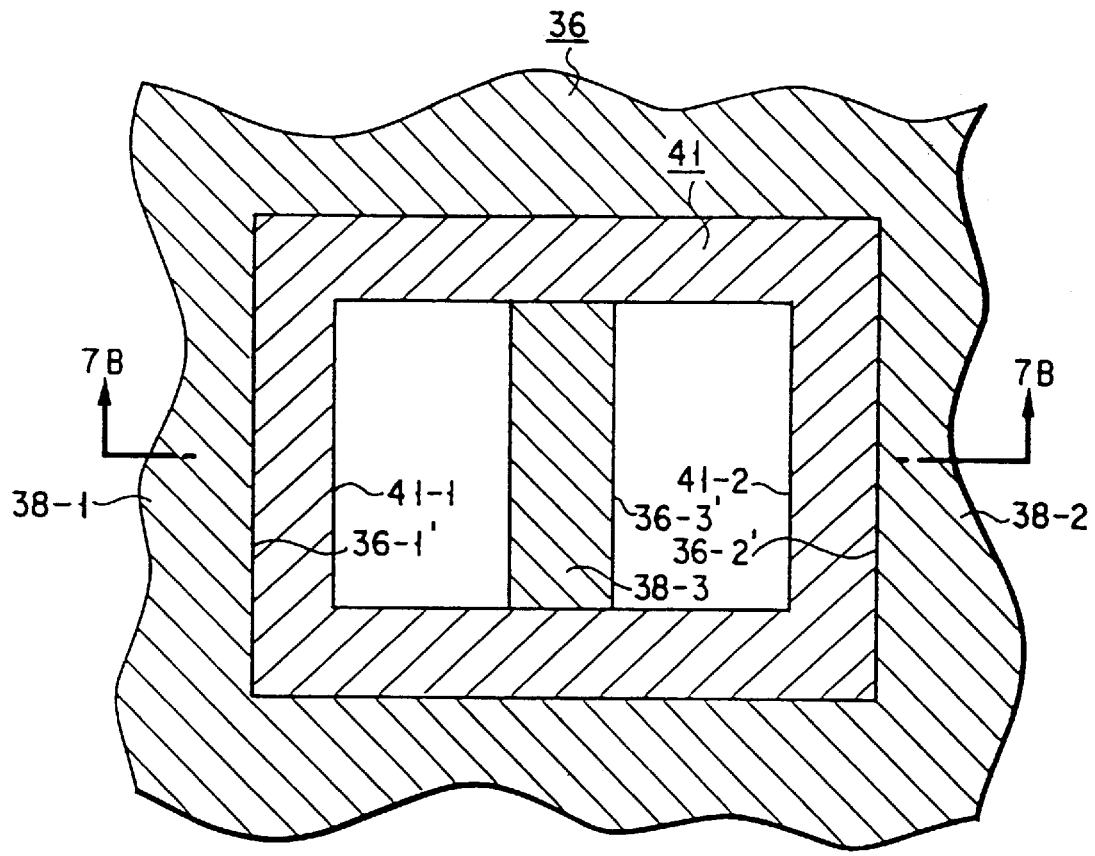
FIG. 7A is a pattern plan view of an element isolation structure in a bipolar transistor, designed to illustrate a semiconductor device and a method of manufacturing the device, according to the third embodiment of the present invention.
Figure 7B:
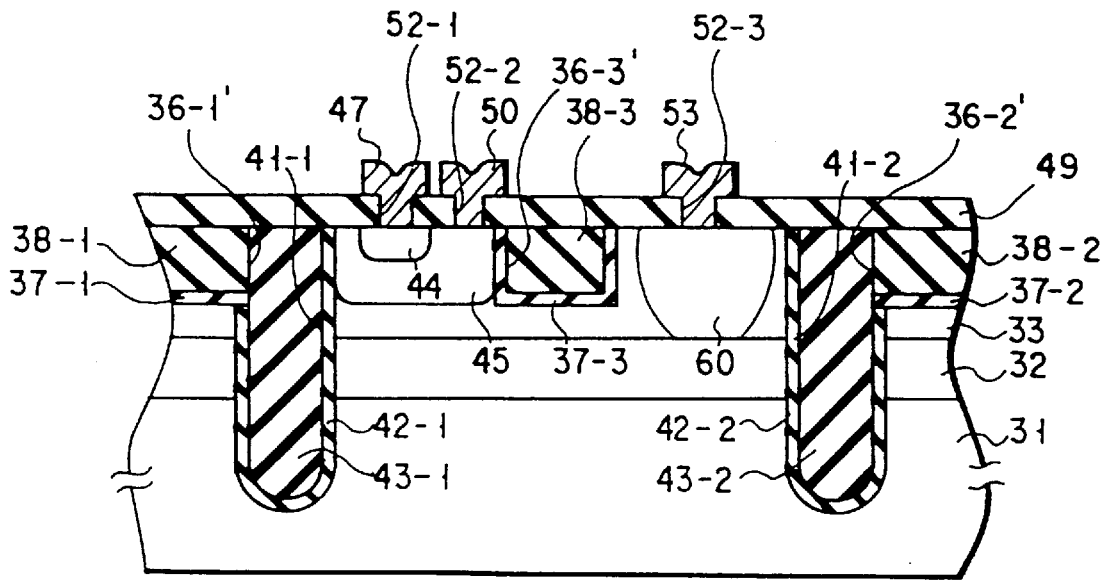
FIG. 7B is a cross sectional view of the bipolar transistor taken along the line 7B—7B in FIG. 7A.

FIGS. 7A and 7B are designed to illustrate a semiconductor device and a method of manufacturing such a device, according to the third embodiment of the present invention, and specifically, FIG. 7A is a pattern plan view focusing on the element isolation structure in the bipolar transistor, and FIG. 7B is a cross sectional view of the bipolar transistor, taken along the line 7B—7B in FIG. 7A. In the element isolation structure shown in FIGS. 7A and 7B, a deep second trench 41 (41-1, 41-2) is made so as to surround an element region in which a bipolar transistor is to be formed, and a shallow first trench 36 (36-1', 36-2') is made in the periphery portion of the second trench 41. Further, a shallow third trench 36-3' is made so as to isolate the element region surrounded by the second trench 41. The third trench 36-3' is made in the same etching step as for the first trenches 36-1' and 36-2'. In one of regions surrounded by the second trench 41 and isolated from each other by the third trench 36-3', a base region 45 is formed, and an emitter region 44 is formed in the surface region of the base region 45. In the other region surrounded by the second trench 41 and isolated from each other by the third trench 36-3', an N$^+$-type impurity diffusion region 60 is formed to have such a depth that the region 60 reaches an N$^+$-type buried layer 32. The region 60 is provided so as to lead out a collector. The depth of each of the first and third trenches 36-1', 36-2' and 36-3' is in a range of 0.25 to 1.5 $\mu$m, and the depth of the second trench 41 is in a range of 3.0 to 10.0 $\mu$m.

The manufacturing steps for manufacturing a bipolar transistor having the element isolation structure shown in FIGS. 7A and 7B are basically the same as the steps (1) to (9) shown in FIGS. 4A to 4I, except for the following. That is, in the step shown in FIG. 4B, the pattern of the mask used for making the first trenches 36-1 and 36-2 is changed to the pattern used for making the first and third trenches 36-1', 36-2' and 36-3', which is hatched as shown in FIG. 7A. With this pattern, the first trenches 36-1' and 36-2' and the third trench 36-3' are made at the same time. After that, through the manufacturing steps shown in FIGS. 4C to 4I, the element isolation region is formed. Then, the manufacturing process for a conventional bipolar transistor is carried out, thereby forming the emitter region 44, the base region 45, the N$^+$-type impurity diffusion region 60, a CVD-SiO$_2$ film 49, contact holes 52-1, 52-2 and 52-3, an emitter electrode 47, a base electrode 50, a collector electrode 53 and the like.

According to the above-described structure and manufacturing method, a thick thermal-SiO$_2$ film such as a field oxide film formed by the LOCOS method, is not formed. Consequently, a large bird's beak is not generated in the element region, and the element region can be reduced in size to the minimum area required by the device. Thus, a high degree of integration of the device can be achieved. Further, in accordance with an increase in integration of the device, the parasitic capacitance is reduced, the operation speed can be increased. Further, the CVD-SiO$_2$ films 43-1 and 43-2 are buried in the deep trenches 41-1 and 41-2, and therefore the widths of the trenches 41-1 and 41-2 can be decreased as compared to those of the conventional manufacturing method, in which a polysilicon layer is buried in a trench, and also the parasitic capacitance of each of the trenches 41-1 and 41-2 can be decreased. Consequently, the degree of integration and the operation speed can be further increased.

Figure 8:
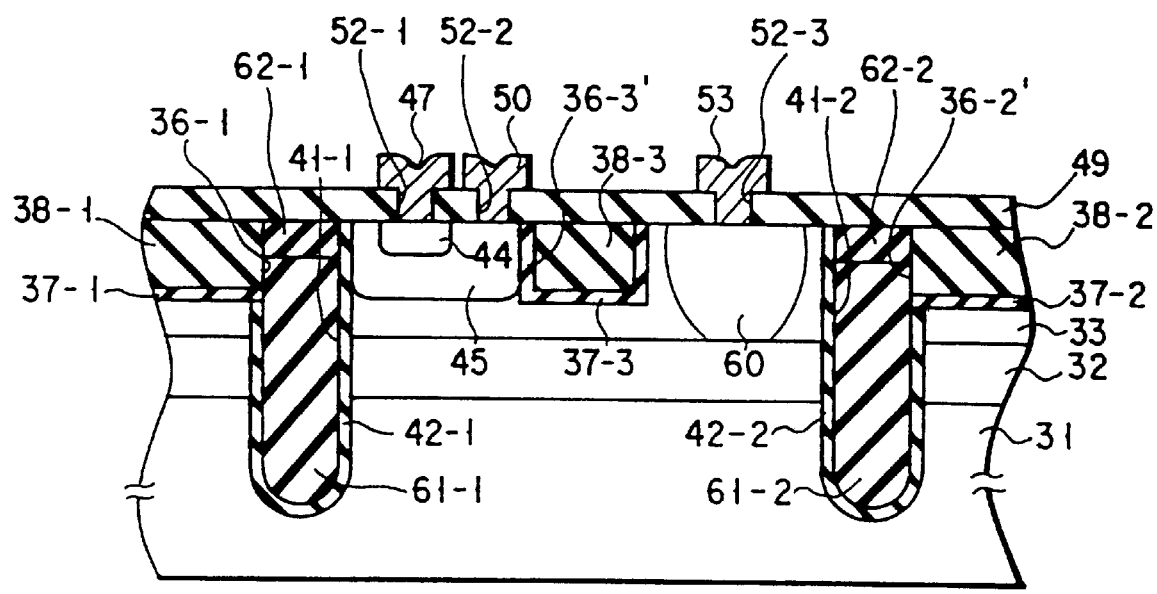
FIG. 8 is a cross sectional view of the structure of a bipolar transistor, designed to illustrate a semiconductor device and a method of manufacturing the device, according to the fourth embodiment of the present invention.

FIG. 8 is a cross sectional view of another structural example of the bipolar transistor, designed to illustrate a semiconductor device and a method of manufacturing such a device, according to the fourth embodiment of the present invention. The fourth embodiment has a structure appropriate for the case where the polysilicon layers 61-1 and 61-2 are buried in the deep trenches 41-1 and 41-2 in the third embodiment. In the fourth embodiment, cap films 62-1 and 62-2 (for example, made of SiO$_2$) are provided for the upper portions of the polysilicon layers 61-1 and 61-2, so as to enhance the insulation effect. With structure, the present invention can applied to the case where polysilicon layers 61-1 and 61-2 are buried in trenches 41-1 and 41-2. Apart from the above, the fourth embodiment exhibits the same effects as those of the third embodiment.

In order to manufacture the bipolar transistor shown in FIG. 8, the third thermal-SiO$_2$ films 42-1 and 42-2 are formed in the second trenches 41-1 and 41-2 in the manufacturing step (7) shown in FIG. 4G, and the polysilicon layer 61 is formed on the resultant structure. Further, the second trenches 41-1 and 41-2 are filled with the polysilicon layer 61. Then, the portion of the polysilicon layer 61 on the surface of the wafer is removed by CMP in the manufacture step (8) shown in FIG. 4H, and thus polysilicon layers 61-1 and 61-2 are made to remain only in the second trenches 41-1 and 41-2. Then, thermal oxidation is carried out so as to form the cap films (SiO$_2$ films) 62-1 and 62-2 on the surfaces of the polysilicon layers 61-1 and 61-2. The manufacturing steps from this onward are the same as those of the third embodiment.

As described above, according to the present invention, a semiconductor device capable of increasing the degree of integration and the operation speed, and a method of manufacturing such a device, can be obtained.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:
    forming a first silicon oxide film on a semiconductor substrate by thermal-oxidizing a surface of the semiconductor substrate;
    forming a first silicon nitride film, on the first silicon oxide film, for serving as a stopper for a chemical mechanical polishing process;
    making a first trench by anisotropically etching portions of the first silicon oxide film, the first silicon nitride film, and the semiconductor substrate;
    forming a second silicon oxide film on the surface of the semiconductor substrate exposed by the first trench;
    forming a third silicon oxide film on the first silicon nitride film and the second silicon oxide film;
    chemical mechanical polishing the third silicon oxide film to at least a level substantially equal to the level of the first silicon nitride film;
    forming a second silicon nitride film and a fourth silicon oxide film successively on the first silicon nitride film and the third silicon oxide film;
    removing the fourth silicon oxide film, the second silicon nitride film, the third silicon oxide film and the second silicon oxide film in an area of the first trench by a second anisotropic etching process;
    making a second trench by removing a portion of the semiconductor substrate in the area removed by the second anisotropic etching process;
    removing the fourth silicon oxide film;
    forming a fifth silicon oxide film on the surface of the semiconductor substrate exposed by the second trench;
    forming a polysilicon film on the second silicon nitride film and the fifth silicon oxide film by a chemical vapor deposition process;
    chemical mechanical polishing the polysilicon film to a level substantially equal to the level of the second silicon nitride film;
    forming a sixth silicon oxide film on the polysilicon film by thermal-oxidizing a surface of the polysilicon film;
    removing the second silicon nitride film, the first silicon nitride film, and the first silicon oxide film to expose an element surface of the semiconductor substrate; and
    forming a semiconductor element on the element surface of the semiconductor substrate.

2. The method of claim 1, wherein:
    a depth of the first trench is between 0.25 and 1.5 micrometers; and
    a depth of the second trench is between 3.0 to 10.0 micrometers.

3. A method of manufacturing a semiconductor device, comprising the steps of:
    forming a buried layer of a first conductivity type on a main surface of a silicon substrate of a second conductivity type;
    forming an epitaxial layer of the first conductivity type, on the buried layer, having an impurity concentration lower than that of the buried layer;
    forming a first silicon oxide film on the epitaxial layer by thermal-oxidizing a surface of the epitaxial layer;
    forming a first silicon nitride film, on the first silicon oxide film, for serving as a stopper for a chemical mechanical polishing process;
    making a first trench by anisotropically etching portions of the first silicon oxide film, the first silicon nitride film, and the epitaxial layer;
    forming a second silicon oxide film on the surface of the epitaxial layer exposed by the first trench;
    forming a third silicon oxide film on the first silicon nitride film and the second silicon oxide film;
    chemical mechanical polishing the third silicon oxide film to at least a level substantially equal to the level of the first silicon nitride film;
    forming a second silicon nitride film and a fourth silicon oxide film successively on the first silicon nitride film and the third silicon oxide film;
    removing the fourth silicon oxide film, the second silicon nitride film, the third silicon oxide film and the second silicon oxide film in an area of the first trench by an anisotropic etching process;
    making a second trench by removing portions of the epitaxial layer, the buried layer, and the silicon substrate in the area removed by the anisotropic etching process;
    removing the fourth silicon oxide film;
    forming a fifth silicon oxide film on the surfaces of the epitaxial layer, the buried layer, and the silicon substrate exposed by the second trench;
    forming a polysilicon film on the second silicon nitride film and the fifth silicon oxide film by a chemical vapor deposition process;
    chemical mechanical polishing the polysilicon film to a level substantially equal to the level of the second silicon nitride film;
    forming a sixth silicon oxide film on the polysilicon film by thermal-oxidizing a surface of the polysilicon film;
    removing the second silicon nitride film, the first silicon nitride film and the first silicon oxide film to expose an element surface of the epitaxial layer;
    forming a base region on the epitaxial layer; and
    forming an emitter region in the base region.

4. The method of claim 3, wherein:
    the step of forming the emitter region includes using a polysilicon layer as a diffusion source.

5. A method of manufacturing a semiconductor device, comprising the steps of:
    forming a buried layer of a first conductivity type on a main surface of a silicon substrate of a second conductivity type;

forming an epitaxial layer of the first conductivity type, on the buried layer, having an impurity concentration lower than that of the buried layer;

forming a first silicon oxide film on the epitaxial layer by thermal-oxidizing a surface of the epitaxial layer;

forming a first silicon nitride film, on the first silicon oxide film, for serving as a stopper for a chemical mechanical polishing process;

making a first trench by anisotropically etching portions of the first silicon oxide film, the first silicon nitride film, the epitaxial layer, and the buried layer;

forming a second silicon oxide film on the surface of the epitaxial layer and the buried layer exposed by the first trench;

forming a third silicon oxide film on the first silicon nitride film and the second silicon oxide film;

chemical mechanical polishing the third silicon oxide film to at least a level substantially equal to the level of the first silicon nitride film;

forming a second silicon nitride film and a fourth silicon oxide film successively on the first silicon nitride film and the third silicon oxide film;

removing the fourth silicon oxide film, the second silicon nitride film, the third silicon oxide film and the second silicon oxide film in an area of the first trench by an anisotropic etching process;

making a second trench by removing portions of the buried layer and the silicon substrate in the area removed by the anisotropic etching process;

removing the fourth silicon oxide film;

forming a fifth silicon oxide film on the surfaces of the buried layer and the silicon substrate exposed by the second trench;

forming a polysilicon film on the second silicon nitride film and the fifth silicon oxide film by a chemical vapor deposition process;

chemical mechanical polishing the polysilicon film to a level substantially equal to the level of the second silicon nitride film;

forming a sixth silicon oxide film on the polysilicon film by thermal-oxidizing a surface of the polysilicon film;

removing the second silicon nitride film, the first silicon nitride film and the first silicon oxide film to expose an element surface of the epitaxial layer;

forming a base region on the epitaxial layer; and forming an emitter region in the base region.

6. The method of claim 5, wherein:
the step of forming the emitter region includes using a polysilicon layer as a diffusion source.

7. A method of manufacturing a semiconductor device, comprising the steps of:
forming a first film on a semiconductor substrate;
forming a second film on the first film;
making a first trench by removing the first film, the second film, and the semiconductor substrate;
forming a third film on a surface of the first trench;
forming a fourth film on the third film and the second film;
planarizing the fourth film so as to remain in the first trench, wherein the planarizing stops at the second film;
forming a fifth film and a sixth film successively on the second film and the fourth film;
selectively removing the sixth film, the fifth film, the fourth film, and the third film;

making a second trench by removing a portion of the semiconductor substrate in the area of the selectively removed films;

removing the sixth film;

forming a seventh film in the second trench;

forming an eighth film on the fifth film and the seventh film;

planarizing the eighth film so as to remain in the second trench, wherein the planarizing stops at the fifth film; and removing the fifth film, the second film, and the first film.

8. The method of claim 7, further including the step of:
forming a semiconductor element in a region of the semiconductor substrate exposed by the removing of the fifth film, the second film, and the first film.

9. The method of claim 7, wherein:
a depth of the first trench is between 0.25 and 1.5 micrometers; and
a depth of the second trench is between 3.0 to 10.0 micrometers.

10. A method of manufacturing a semiconductor device, comprising the steps of:
forming a first silicon oxide film on a semiconductor substrate by thermal-oxidizing a surface of the semiconductor substrate;

forming a first silicon nitride film, on the first silicon oxide film, for serving as a stopper for a chemical mechanical polishing process;

making a first trench by anisotropically etching portions of the first silicon oxide film, the first silicon nitride film, and the semiconductor substrate;

forming a second silicon oxide film on the surface of the semiconductor substrate exposed by the first trench;

forming a third silicon oxide film on the first silicon nitride film and the second silicon oxide film;

chemical mechanical polishing the third silicon oxide film to at least a level substantially equal to the level of the first silicon nitride film;

forming a second silicon nitride film and a fourth silicon oxide film successively on the first silicon nitride film and the third silicon oxide film;

removing the fourth silicon oxide film, the second silicon nitride film, the third silicon oxide film and the second silicon oxide film in an area of the first trench by an anisotropic etching process;

making a second trench by removing a portion of the semiconductor substrate in the area removed by the anisotropic etching process;

removing the fourth silicon oxide film;

forming a fifth silicon oxide film on the surface of the semiconductor substrate exposed by the second trench;

forming a sixth silicon oxide film on the second silicon nitride film and the fifth silicon oxide film by a chemical vapor deposition process;

chemical mechanical polishing the sixth silicon oxide film to a level substantially equal to the level of the second silicon nitride film;

removing the second silicon nitride film, the first silicon nitride film, and the first silicon oxide film to expose an element surface of the semiconductor substrate; and forming a semiconductor element on the element surface of the semiconductor substrate.

11. The method of claim 10 wherein:
a depth of the first trench is between 0.25 and 1.5 micrometers; and
a depth of the second trench is between 3.0 to 10.0 micrometers.

12. A method of manufacturing a semiconductor device, comprising the steps of:
forming a buried layer of a first conductivity type on a main surface of a silicon substrate of a second conductivity type;
forming an epitaxial layer of the first conductivity the, on the buried layer, having an impurity concentration lower than that of the buried layer;
forming a first silicon oxide film on the epitaxial layer by thermal-oxidizing a surface of the epitaxial layer;
forming a first silicon nitride film, on the first silicon oxide film, for serving as a stopper for a chemical mechanical polishing process;
making a first trench by anisotropically etching portions of the first silicon oxide film, the first silicon nitride film, and the epitaxial layer;
forming a second silicon oxide film on the surface of the epitaxial layer exposed by the first trench;
forming a third silicon oxide film on the first silicon nitride film and the second silicon oxide film;
chemical mechanical polishing the third silicon oxide film to at least a level substantially equal to the level of the first silicon nitride film;
forming a second silicon nitride film and a fourth silicon oxide film successively on the first silicon nitride film and the third silicon oxide film;
removing the fourth silicon oxide film, the second silicon nitride film, the third silicon oxide film and the second silicon oxide film in an area of the first trench by an anisotropic etching process;
making a second trench by removing portions of the buried layer and the silicon substrate in the area removed by the anisotropic etching process;
removing the fourth silicon oxide film;
forming a fifth silicon oxide film on the surfaces of the buried layer and the silicon substrate exposed by the second trench;
forming a sixth silicon oxide film on the second silicon nitride film and the fifth silicon oxide film by a chemical vapor deposition process;
chemical mechanical polishing the sixth silicon oxide film to a level substantially equal to the level of the second silicon nitride film;
removing the second silicon nitride film, the first silicon nitride film and the first silicon oxide film to expose an element surface of the epitaxial layer;
forming a base region on the epitaxial layer; and
forming an emitter region in the base region.

13. The method of claim 12 wherein:
the step of forming the emitter region includes using a polysilicon layer as a diffusion source.

14. A method of manufacturing a semiconductor device, comprising the steps of:
forming a buried layer of a first conductivity type on a main surface of a silicon substrate of a second conductivity type;
forming an epitaxial layer of the first conductivity type, on the buried layer, having an impurity concentration lower than that of the buried layer;
forming a first silicon oxide film on the epitaxial layer by thermal-oxidizing a surface of the epitaxial layer;
forming a first silicon nitride film, on the first silicon oxide film, for serving as a stopper for a chemical mechanical polishing process;
making a first trench by anisotropically etching portions of the first silicon oxide film, the first silicon nitride film, the epitaxial layer, and the buried layer;
forming a second silicon oxide film on the surface of the epitaxial layer and the buried layer exposed by the first trench;
forming a third silicon oxide film on the first silicon nitride film and the second silicon oxide film;
chemical mechanical polishing the third silicon oxide film to at least a level substantially equal to the level of the first silicon nitride film;
forming a second silicon nitride film and a fourth silicon oxide film successively on the first silicon nitride film and the third silicon oxide film;
removing the fourth silicon oxide film, the second silicon nitride film, the third silicon oxide film and the second silicon oxide film in an area of the first trench by an anisotropic etching process;
making a second trench by removing portions of the buried layer and the silicon substrate in the area removed by the anisotropic etching process;
removing the fourth silicon oxide film;
forming a fifth silicon oxide film on the surfaces of the buried layer and the silicon substrate exposed by the second trench;
forming a sixth silicon oxide film on the second silicon nitride film and the fifth silicon oxide film by a chemical vapor deposition process;
chemical mechanical polishing the sixth silicon oxide film to a level substantially equal to the level of the second silicon nitride film;
removing the second silicon nitride film, the first silicon nitride film and the first silicon oxide film to expose an element surface of the epitaxial layer;
forming a base region on the epitaxial layer; and
forming an emitter region in the base region.

15. The method of claim 14, wherein:
the step of forming the emitter region includes using a polysilicon layer as a diffusion source.

* * * * *

UNITED STATES PATENT AND TRADEMARK OFFICE
CERTIFICATE OF CORRECTION

PATENT NO. : 5,943,578
DATED : August 24, 1999
INVENTOR(S) : Ichiro KATAKABE et al.

It is certified that error appears in the above-identified patent and that said Letters Patent is hereby corrected as shown below:

Claim 11, Column 13, line 1, after "claim 10" insert --,--.

Claim 12, Column 13, line 11, "conductivity the " should read --conductivity type--.

Claim 13, Column 13, line 58, after "claim 12", insert --,--.

Signed and Sealed this

Twenty-seventh Day of February, 2001

Attest:

NICHOLAS P. GODICI

Attesting Officer

Acting Director of the United States Patent and Trademark Office